United States Patent [19]

Reed et al.

[11] Patent Number: 4,984,352
[45] Date of Patent: Jan. 15, 1991

[54] THIN PANEL DRILLING METHOD AND APPARATUS

[75] Inventors: Herbert M. Reed, Duncansville; Scott J. Sager, Altoona; Alexander Grebenyuk, Hollidaysburg; Stephen F. Torchia, Seward, all of Pa.

[73] Assignee: Micromation Systems, Inc., Altoona, Pa.

[21] Appl. No.: 484,905

[22] Filed: Feb. 26, 1990

Related U.S. Application Data

[62] Division of Ser. No. 164,840, Mar. 7, 1988, Pat. No. 4,932,117.

[51] Int. Cl.$^5$ ............................................. B23Q 3/157
[52] U.S. Cl. ........................................ 29/568; 408/67; 408/1 R; 409/137
[58] Field of Search ................. 29/568, 26 A; 408/68, 408/98, 1 R; 409/136, 137

[56] References Cited

U.S. PATENT DOCUMENTS 4,340,326 7/1982 Buonauro et al. ............... 409/137 X
4,813,825 3/1989 Kosmowski ........................ 408/98

Primary Examiner—Z. R. Bilinsky
Attorney, Agent, or Firm—Fidelman & Wolffe

[57] ABSTRACT

The invention is directed to a method and apparatus for selectively and simultaneously drilling a plurality of holes in thin panels such as printed circuit boards, while providing for automatic changing of the drill bits, individually or plurally, as required. A tray of drill bits is driveable in X and a row of vacuum pickers are driveable in Y, so that the various bit locations of the tray are addressable by such X-Y positioning, and selectable vacuum pickers are extensible and retractable so as to pick and place the drill bits at various matrix locations of the tray. The vacuum pickers also are extensible and retractable through corresponding tray openings in order to deliver replacement bits to, and retrieve used bits from, a flipper assembly associated with each drilling module. Each flipper assembly transfers bits back and forth between the vacuum picker and drill without having to transfer either bit through the opening in a footprint portion of the pressure foot which engages the materials to be drilled during the drilling operation. Thus, the footprint opening may be made smaller in diameter than depth stop collars or the like which are of greater diameter than the working portion of the bit which is advanced through the footprint opening during drilling. This smaller footprint opening of the pressure foot is for minimizing or eliminating hole "smears" and for overcoming problems normally associated with the so-called "oil can effect".

7 Claims, 15 Drawing Sheets

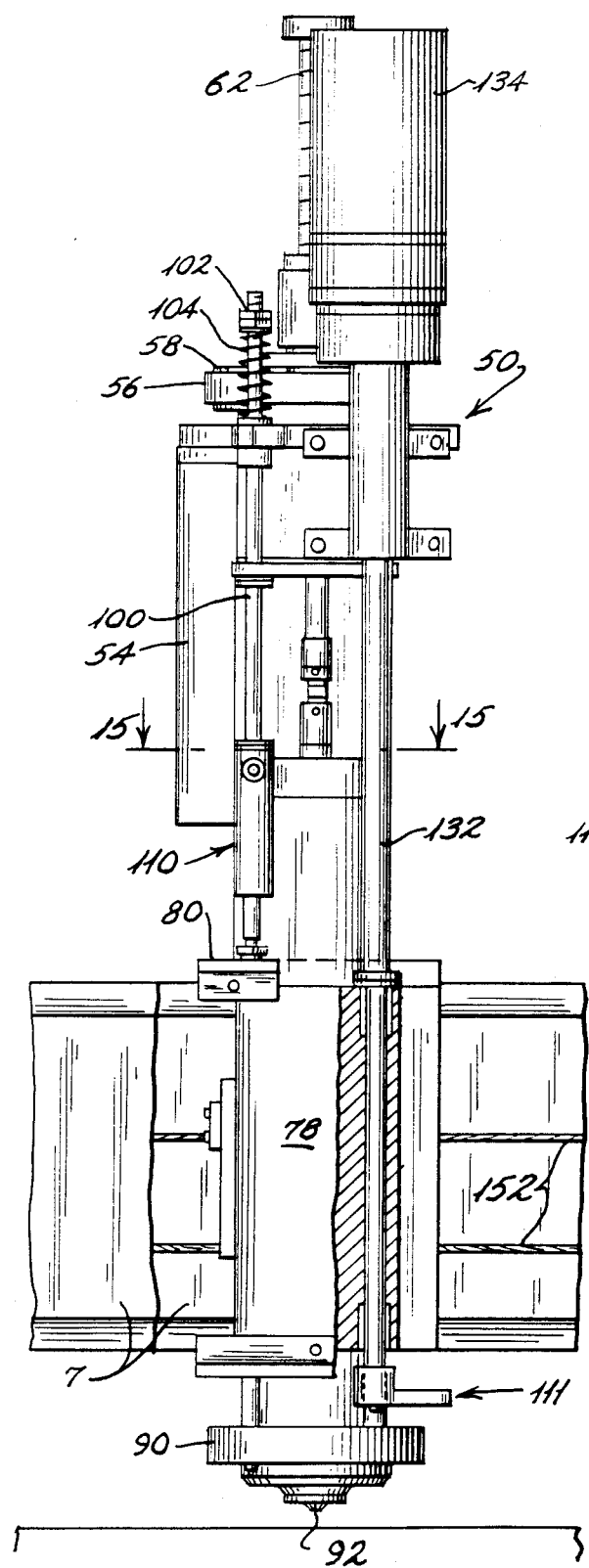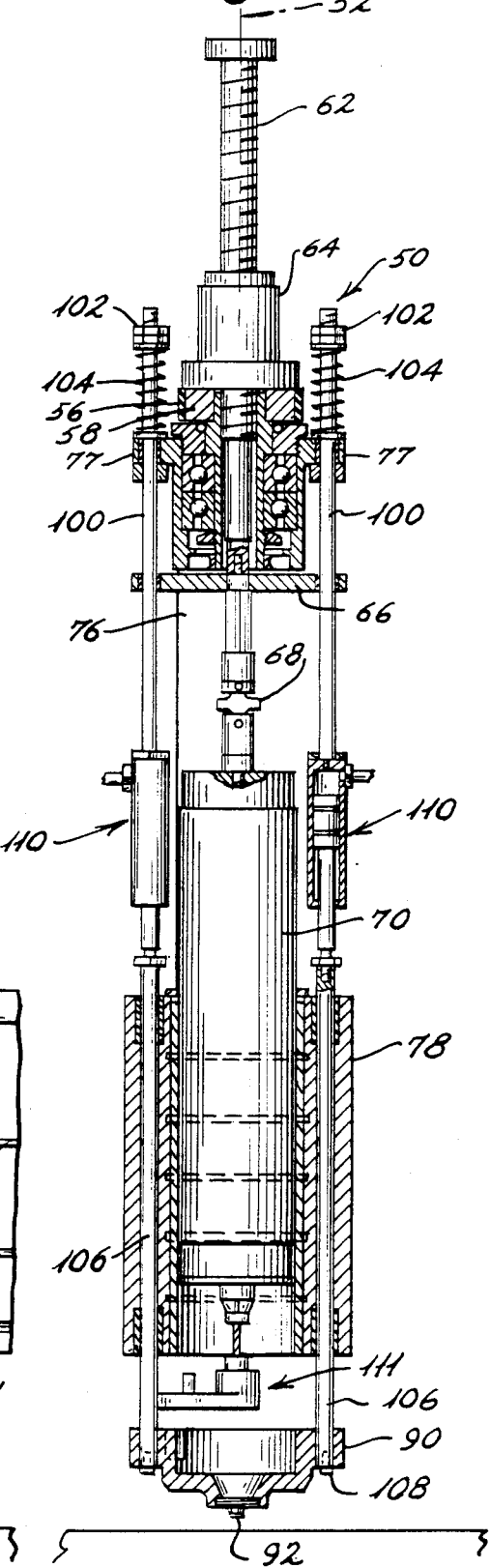

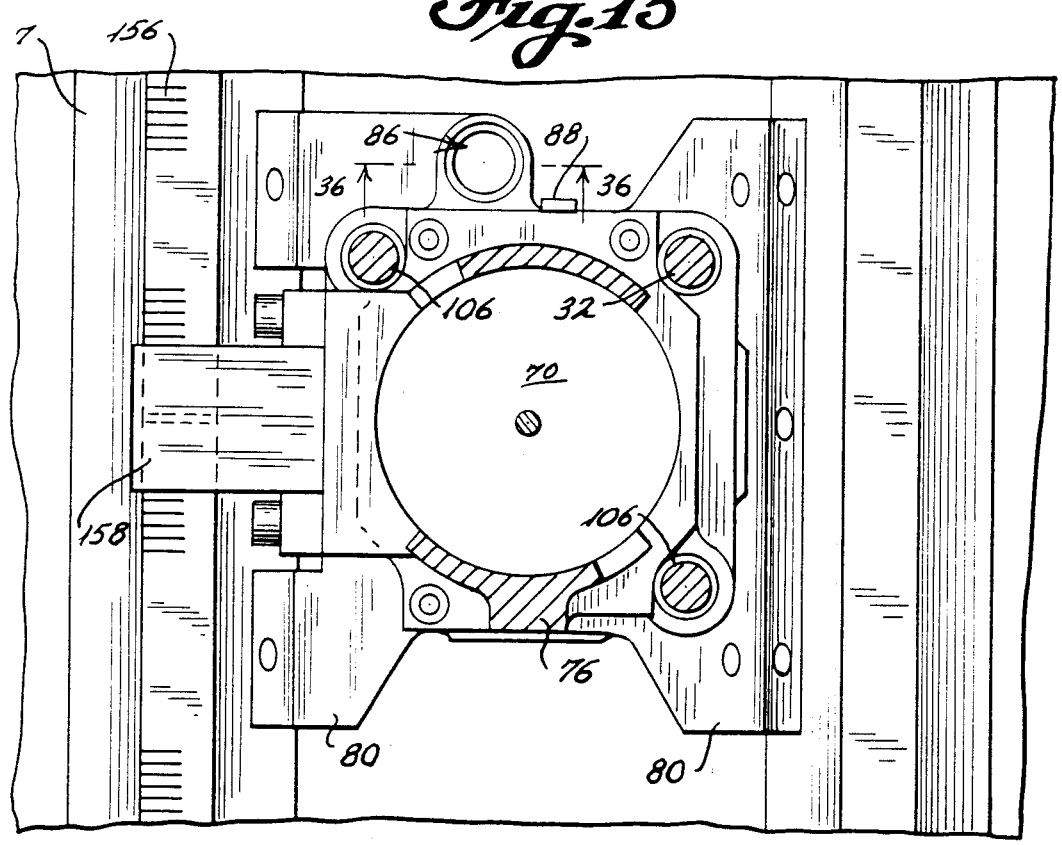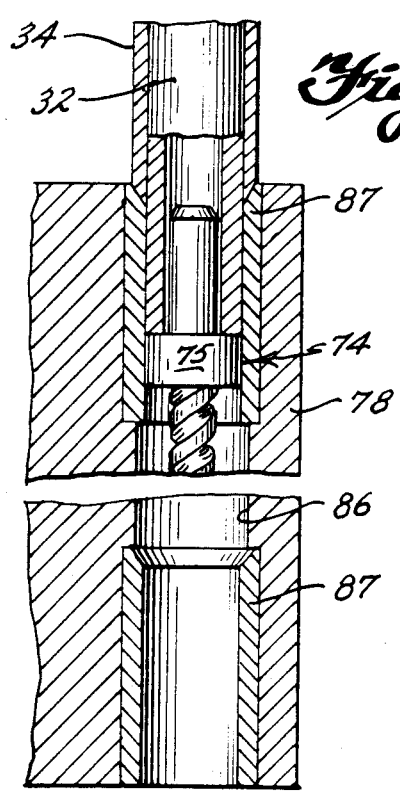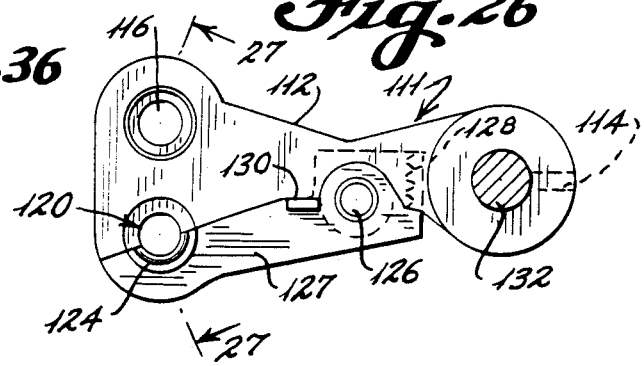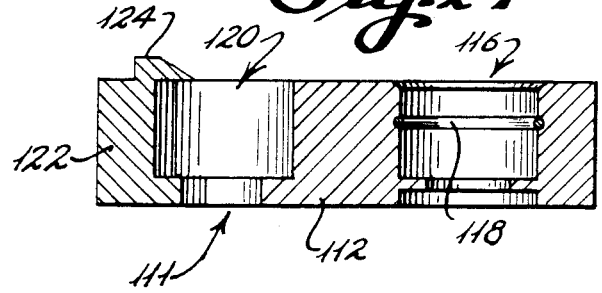

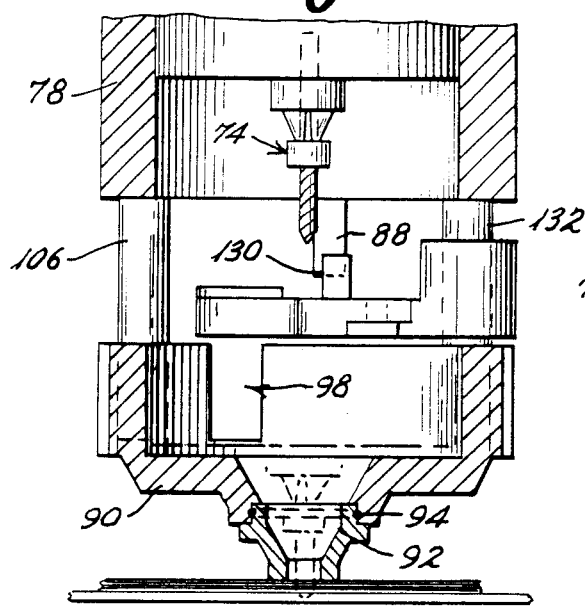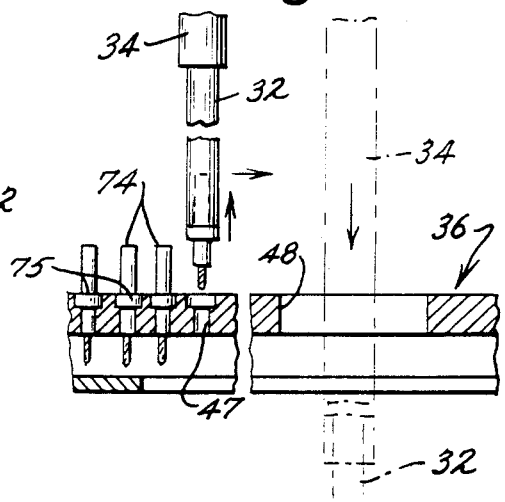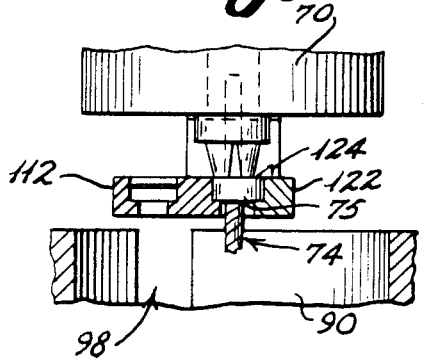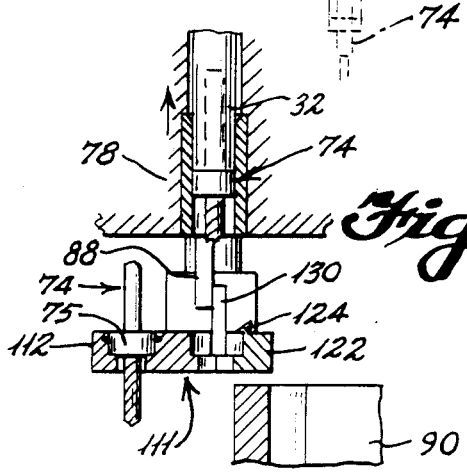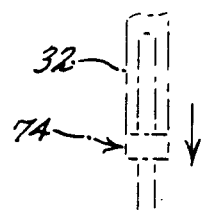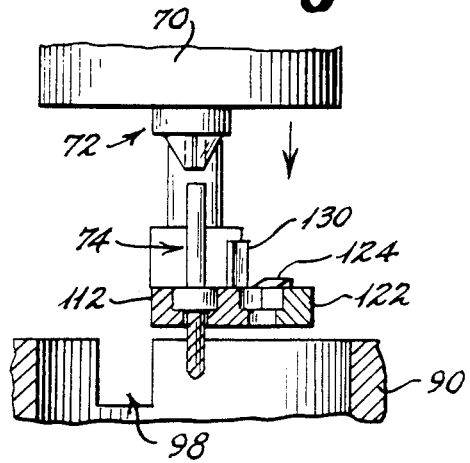

POWER DISTRIBUTION

OIL CAN EFFECT CAUSED BY LARGE
PRESSURE FOOT FOOTPRINT IN THIN PANEL DRILLING

THIN PANEL DRILLING METHOD AND APPARATUS

This application is a divisional of Ser. No. 164,840, filed Mar. 7, 1988, now U.S. Pat. No. 4,932,117.

PRIOR ART CROSS-REFERENCES

U.S. Pat. No. 2,267,336—METHOD AND APPARATUS FOR FABRICATION OF SHEET METAL COVERING PARTS—Kindelberger, issued Dec. 23, 1941.

U.S. Pat. No. 3,678,572—TOOL CHANGER—Mello et al., issued July 25, 1972.

U.S. Pat. No. 4,679,296—MACHINE TOOL—Watanabe et al, issued July 14, 1987.

U.S. Pat. No. 3,200,492—MULTIPLE USE MACHINE WITH TOOL CHANGER—Lehmkuhl, issued August 17, 1965.

U.S. Pat. No. 4,041,601—MACHINE TOOL WITH AN AUTOMATIC TOOL CHANGER—Schimanski, issued Aug. 16, 1977.

U.S. Pat. No. 3,276,116—TOOL CHANGER—Stark, issued Oct. 4, 1986.

U.S. Pat. No. 3,775,837—NUMERICALLY CONTROLLED MACHINE TOOL WITH AUTOMATIC TOOL CHANGING APPARATUS, issued Dec. 4, 1973.

U.S. Pat. No. 3,844,028—AUTOMATIC TOOL CHANGER—Hague et al., issued Oct. 29, 1974.

BACKGROUND AND SUMMARY OF THE INVENTION

This invention relates to a method and apparatus for drilling a plurality of holes in sheet-like material, especially multi-ply printed circuit board material.

One feature of the invention provides a drill bit changing arrangement which maintains replacement bits in an array in a supply tray located above the drills so that no interference will be occasioned therebetween. The storage capacity of the supply tray of the invention is thus not limited by those considerations which would impose restriction upon a supply which is required to move to locations proximate the drill for a bit changing operation. This also allows supply tray replacement during the drilling operation. Other features of the invention comprise a flipper having pockets in which bits are receivable for lateral transfer to and from a central axis of each drill for the bit changing operation and a vacuum tube "picker" by which the bits are transferred back and forth between the flipper and the supply tray.

Accordingly, the invention provides a bit changing arrangement which alleviates problems of interference of the supply with the work piece or the drill, while enhancing the bit storage capacity and drilling machine versatility.

Of the prior art cross referenced above, U.S. Pat. No. 2,267,336 discloses interchangeable inserts 35 for a pressure foot 34, but there is no provision for or suggestion of a drill bit supply and/or changing means therein. Even more importantly, this reference does not disclose or suggest scrap evacuation and the problems inherent therein.

Each of the other cross referenced patents discloses an individual drill and laterally displaceable tool changer for the drill, with the replacement drill bits being stored in an adjacent endless conveyor or carousel or a supply integral with the housing of the drill.

Other features of the invention will become apparent from the following disclosure.

The invention is directed to a method and apparatus for selectively and simultaneously drilling a plurality of holes in thin panels such as printed circuit boards, while providing for automatic changing of the drill bits, individually or plurally, as required. A tray of drill bits is driveable in X and a row of vacuum pickers are driveable in Y, so that the various bit locations of the tray are addressable by such X-Y positioning, and selectable vacuum pickers are extensible and retractable so as to pick and place the drill bits at various matrix locations of the tray. The vacuum pickers also are extensible and retractable through corresponding tray openings in order to deliver replacement bits to, and retrieve used bits from, a flipper assembly associated with each drilling module. Each flipper assembly transfers bits back and forth between the vacuum picker and drill without having to transfer either bit through the opening in a footprint portion of the pressure foot which engages the materials to be drilled during the drilling operation. Thus, the footprint opening may be made smaller in diameter than depth stop collars or the like which are of greater diameter than the working portion of the bit which is advanced through the footprint opening during drilling. This smaller footprint opening of the pressure foot is for minimizing or eliminating hole "smears" and for overcoming problems normally associated with the so-called "oil can effect".

The replacement bits utilized in the industry for which the instant invention is particularly applicable generally have depth stop collars attached to the drill bits prior to their supply to the drill. These collars generally are adjustably positioned along the length of the drill bit so as to compensate for changes in the length of the bit, as might occur upon resharpening of a bit, and thus to maintain a preferred depth of penetration of the bit into the work. Since the drill bits utilized in this industry generally have been changed heretofore by passing them through the bottom hole of the pressure foot while the collar is still attached thereto, and since the collars are larger in diameter than the drill bits, a larger footprint opening is required in the pressure foot generally used with these drills.

Excessive burring and wicking path fractures can and do occur from the "oil can effect" on the material being drilled when the footprint opening of the pressure foot is relatively much larger than the diameter of the drill bit.

A further disadvantage of having such an enlarged hole in the bottom of the pressure foot is that the vacuum drawn on the pressure foot, in order to evacuate the scrap or chad circuit board material therefrom, is not concentrated upon the flutes of the drill bit as much as when the hole of the pressure foot is much closer to the size of the bit itself. Thus, the chad that is not removed from the flutes is transferred onto the internal surfaces of subsequently drilled holes, so that these bits of chad become packed at various spots along the internal diameters of the subsequently drilled holes.

Typically, the internal diameters of these holes have copper applied thereto during water and chemical "electroless" baths such that water can get in or behind the packings or so-called "smears" of chad. Ferrules of copper are then electroplated onto the initially applied copper, and the water behind the resin packings can cause "pops" in the final ferrules upon passing of the boards through subsequent reflow or wave soldering processes at which temperatures typically reach 550° F. Even if the ferrule does not pop, it is weakened sufficiently to cause electrical failures during the subsequent expansion and contraction thereof in normal use. Further, the epoxy resin "packing" can serve as an insulator blocking a required electrical connection between internal copper tracks of multiple layer boards and the finished copper ferrule.

Thus, there is a definite need in the industry for eliminating such packings or smears of chad on the inside diameters of the drilled holes. Heretofore, in order to overcome this problem, the resin portions of the hole have been etched away to a larger diameter than the copper layer portions by means of sulfuric acid or plasma or the like.

By the instant invention, drill bits are changed without passing through the bottom hole of the pressure foot so that the hole may be much closer in diameter to the working portion of the drill bit. Thus, there is an increased vacuum effect in the footprint opening upon the chad caught in the flutes of the drill bit during retraction of the bit from the material. Still more concentration of the vacuum in the drill flutes may be provided by grooving or fluting the internal surface of the pressure foot in or near the inner surface of the footprint opening so as to cause a swirling air flow.

These and other features of the instant invention and their distinctions over the prior art will become more apparent from the following detailed disclosure. The invention comprises several steps and the relation of one or more of such steps with respect to each of the others and the apparatus embodying features of construction, combinations of elements, and arrangement of parts which are adapted to effect such steps, all as exemplified in the following detailed disclosure.

BRIEF DESCRIPTION OF THE DRAWINGS

FIG. 13 is a partial side elevation of a drill assembly as viewed generally in the direction of arrows 13—13 of FIG. 7.

FIG. 14 is a cross sectional view through a drill assembly as generally indicated by the arrows 14—14 in FIG. 7.

FIG. 15 is a cross sectional view as generally indicated by arrows 15—15 of FIG. 13.

FIG. 16 is a partial cross section of a drill assembly illustrating the raised and lowered positions of the drill.

FIG. 17 is a partial cross section illustrating the manner in which a picker is passed through an opening in the supply tray during transfer of a bit to or from the flipper assembly.

FIG. 22 is a partial cross section as viewed generally in the direction of arrows 22—22 of FIG. 18.

FIG. 23 is a partial cross section as viewed generally in the direction of arrows 23—23 of FIG. 19.

FIG. 24 is a partial cross section as viewed generally in the direction of arrows 24—24 of FIG. 20.

FIG. 25 is a partial cross section as viewed generally in the direction of arrows 25—25 of FIG. 21.

FIG. 26 is a top plan view of the flipper of the invention.

FIG. 27 is a cross section as generally viewed in the direction of arrows 27—27 of FIG. 26.

FIG. 36 is an enlarged, fragmentary cross-section illustrating a passage through the lower housing and the guide bushing therein.

DETAILED DESCRIPTION OF THE INVENTION

Figure 1:
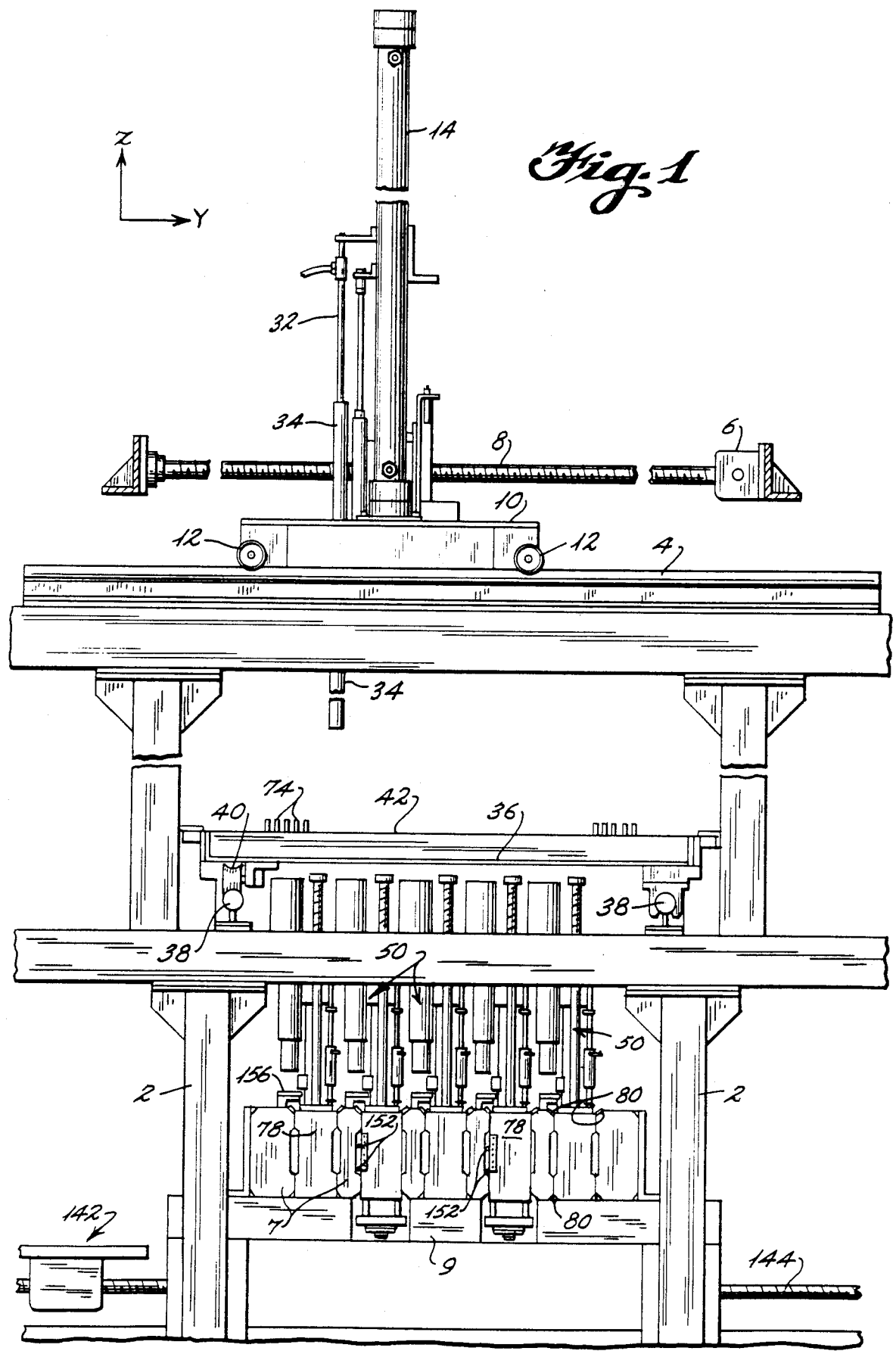
FIG. 1 is a side elevation of the apparatus of the invention, as viewed along the X axis.
Figure 2:
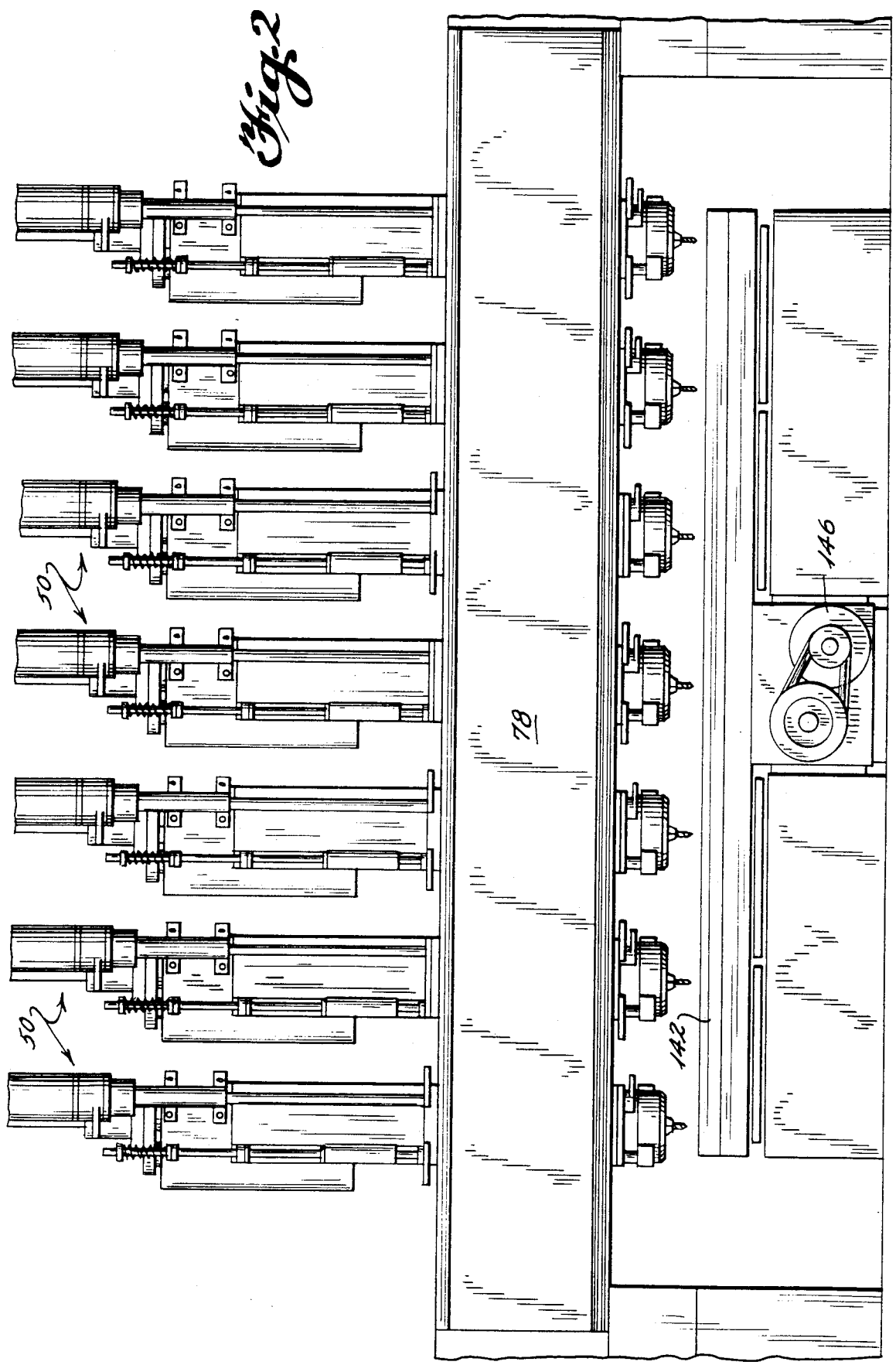
FIG. 2 is a partial front elevation of the apparatus of the invention as viewed along the Y axis.
Figure 3:
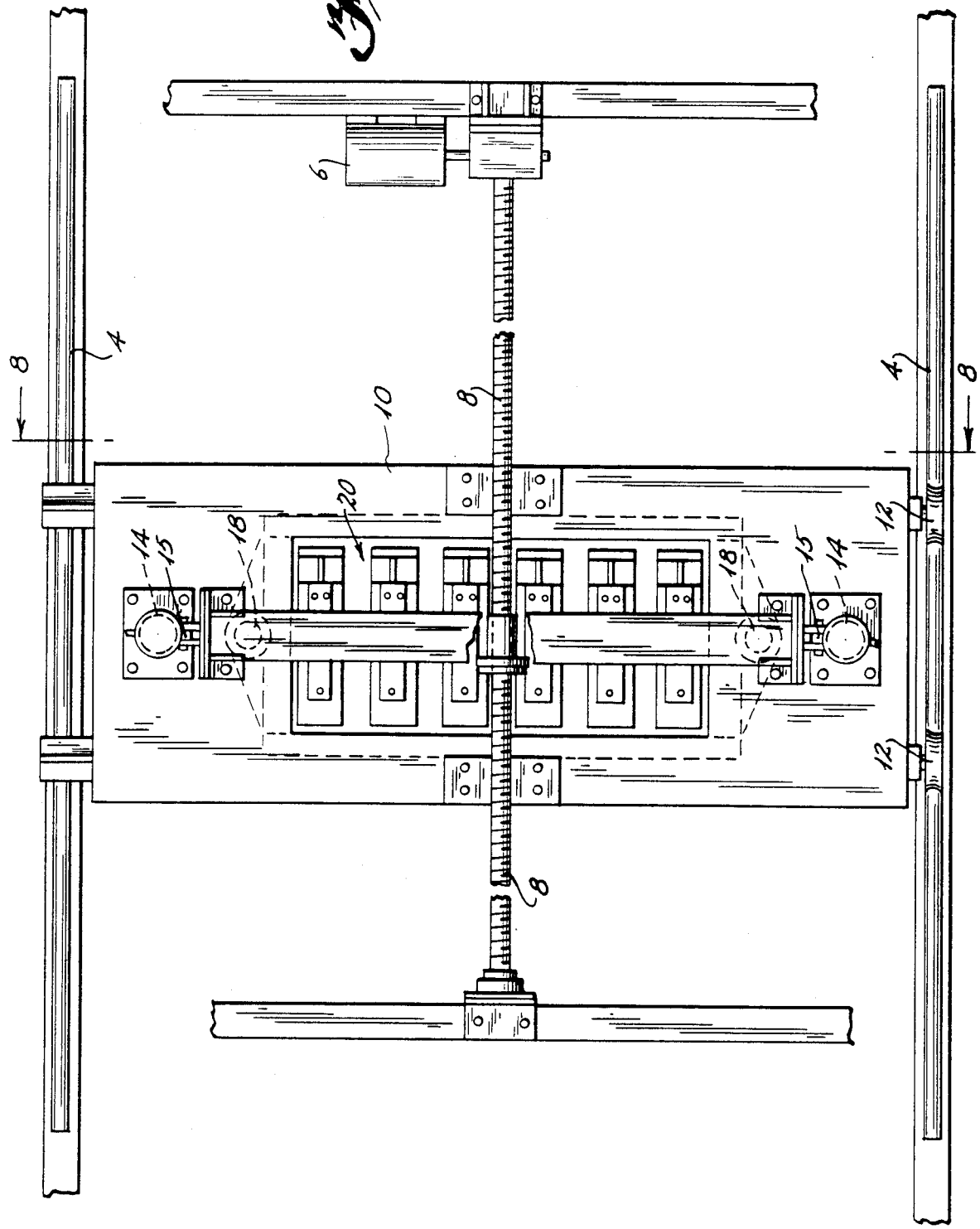
FIG. 3 is a partial top plan view of the device of FIG. 1.

Referring to FIGS. 1 and 2, a work support table 142 is moveable in the Y direction via feed screw 144 and motor 146 in a stepwise manner in order to feed the work material underneath the banks or rows of drill assemblies 50, with each row of drill assemblies being parallel to the X axis of a cartesian coordinate system. Each drill assembly 50 of each row is individually moveable in the X direction via attachment to a cable 152. Cable 152 is looped around pulleys at opposite ends of each row with a drive motor provided for each such cable so as to position each individual drill assembly in X, within limits which are readily discernible by reference to FIG. 7 and according to a program corresponding to the circuit board to be drilled. Thereafter, hydraulic drilling motors 70 (FIGS. 13 and 14) with rotating bits 74 are advanced into drilling engagement with the circuit board material by a drill Z-axis motor 54 of each drill assembly 50. Each drill assembly is supported between two spaced longitudinal granite beams 7 which, in turn, are supported by a granite bed.

Figure 4:
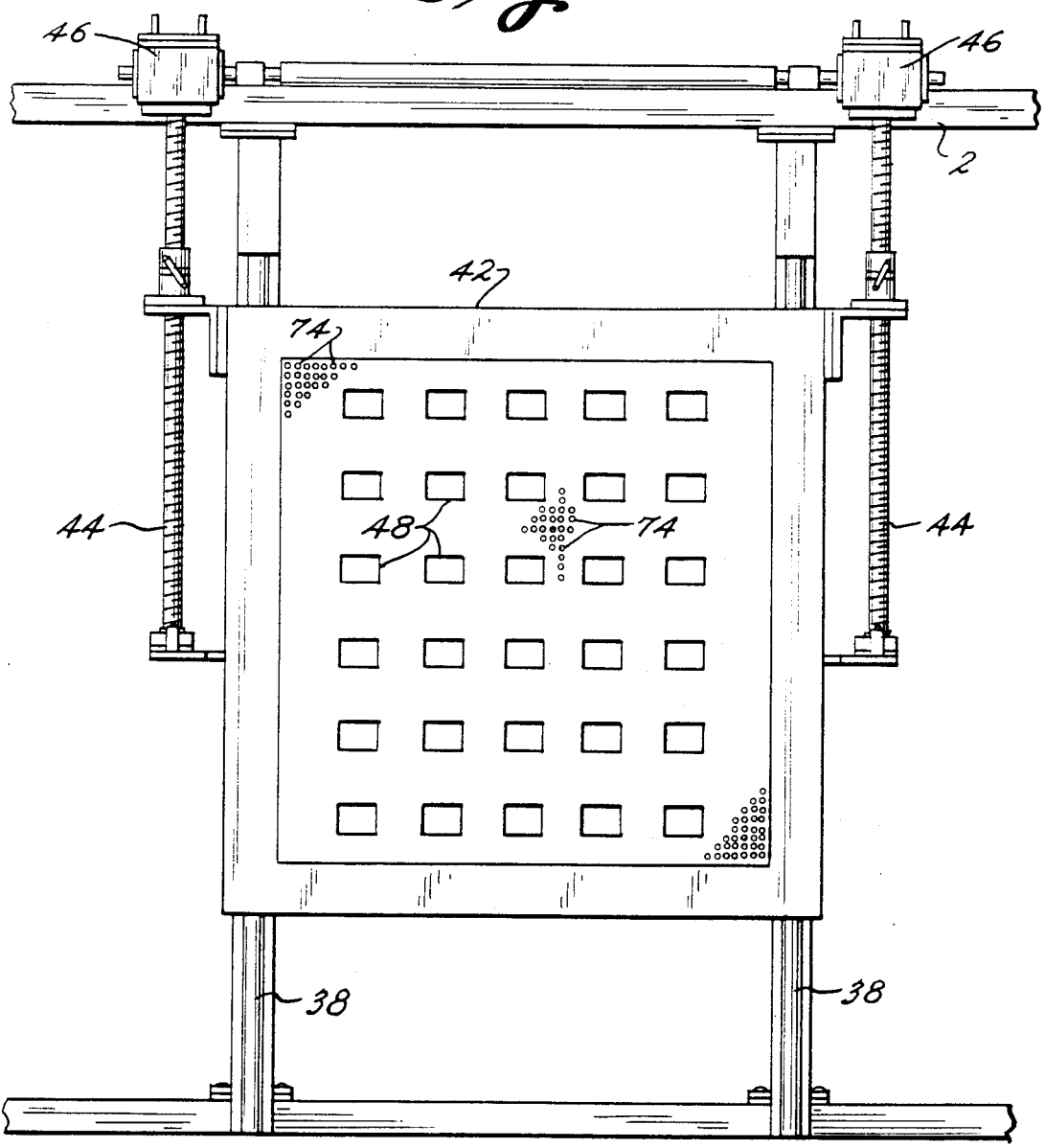
FIG. 4 is a top plan view of the supply tray and means for moving it in the X direction.
Figure 5:
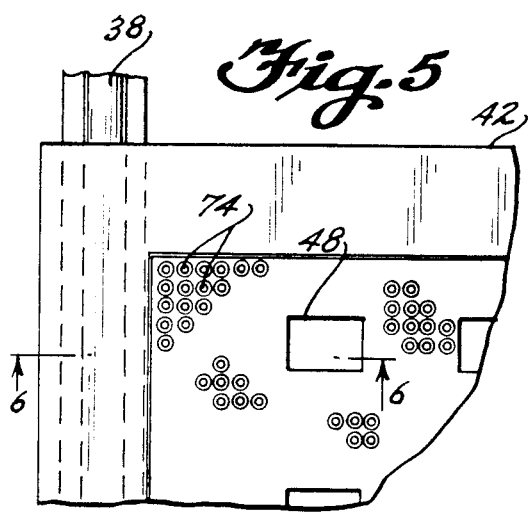
FIG. 5 is an enlarged portion of the supply tray of FIG. 4.
Figure 6:
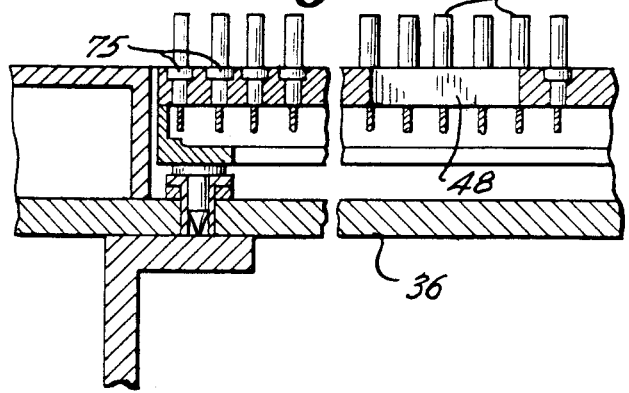
FIG. 6 is an enlarged cross section, as generally indicated by the arrows 6—6 of FIG. 4.

As seen in FIGS. 1 and 4, steel frame 2 supports Thompson rods 38 which, in turn, support a wheeled platform 36 that is displaceable in the X direction upon actuation of feed screws 44 by motors 46 in accordance with a program subroutine directed to drill bit changing. Platform 36 supports drill bit tray 42 having an array of drill bit receiving holes 47 interrupted by rows of larger passages 48 through the tray and which correspond the rows of drill assemblies 50.

Positioned above the supply tray 42 is a wheeled "picker" carriage 10 that is displaceable in the Y direction by means of electric motor 6 and feed screw 8, also under control of the drill bit replacement subroutine of the program. As seen in FIGS. 1, 3, and 8-10, the carriage has vertical fluid jacks 14 supporting a horizontal cross bar 16 according to actuation of jacks 14. Vertically depending posts 18 are attached to cross bar 16 and provide suspended support of platform 22 on which a row of vacuum picker modules 20 are mounted.

Each picker module comprises a base 23 and a vertical guide rod 26 supported thereon by a bracket 24. A slide 30 is moveable up and down guide rod 26 according to actuation of a pneumatic cylinder 28, with slide 30 providing suspended support of a vacuum spindle or tube 32 therefrom. Vacuum tube 32 is telescopic within a guide tube 34 which is also fixed to and extends through platform 22. Thus, all of the picker modules 20 are displaceable in unison in the Z direction by actuation of fluid jacks 14; and the vacuum tube 32 of an individual picker module 20 is selectively extensible and retractable relative to platform 22 according to actuation of a corresponding pneumatic cylinder 28.

Thus, the X movement of wheeled platform 36 and Y movement of wheeled carriage 10 allows alignment between each vacuum picker tube 32 and a great many locations on tray 42 to facilitate selective picking and placing of drill bits at these locations. A further description of this apparatus in operation will be provided in the following disclosure.

The reader's attention now is directed to FIGS. 13-15 for an understanding of the structure which provides vertical displacement of the drills 70 in the Z direction and horizontal displacement of the drill assemblies in the X direction. Each drill assembly is supported and retained between two granite beams 7 by means of angled flanges 80 of a lower housing assembly 78, with air bearings provided between the granite beams 7 and flanges 80 for smooth ride of the drill assemblies 50 along the granite beams 7. As indicated earlier, cable 152 is looped around pulleys on opposite ends of the granite beams and the top run of each cable 152 (FIG. 13) is attached to a corresponding lower housing 78 in order to horizontally displace the drill assembly 50 upon actuation of a cable driving motor (not shown) and according to a control program, with the position of each drill assembly 50 in the X direction being monitored by encoder strips 156 and a reader 158 (FIG. 15).

Upper housing portion 76 is attached to lower housing 78 and provided with large openings in the circumference thereof allowing ease of access to the normal hydraulic fittings and tubing at or near the top of hydraulic drill 70. A pulley 58 is keyed to shaft 59 which is rotatably supported within upper housing 76 by bearing assembly 61, and timing belt 56 provides a driving connection between pulley 58 and a motor 54 for raising and lowering drill module 70. A ball screw 62 is coaxial with the longitudinal axis 52 of drill assembly 50 and is displaceable therealong by means of a ball nut 64 attached to pulley 58 for rotation therewith upon actuation of motor 54. As seen in FIG. 14, the drilling module 70 is suspended from the lower end of ball screw 62 by universal connector 68 in order to compensate for any misalignment between ball screw 62 and the longitudinal axis 52 of drill module 70.

A pressure foot 90 depends from each drill assembly 50 by attachment at 108 to a pair of rods 106 which are slidably received within lower housing 78 (FIG. 14). Upper rods 100 are attached to rods 106 by a pneumatic piston/cylinder arrangement 110 and are slidably received within ears 77 (FIG. 14) of upper housing 76. A compression spring 104 is sandwiched between the top surface of each ear 77 and a nut 102 threaded to the top end of a rod 100. Thus, pressure foot 90 is suspended from the top of housing 76 on compression springs 104 when drill module 70 is raised to the position of FIG. 14.

Figure 35:
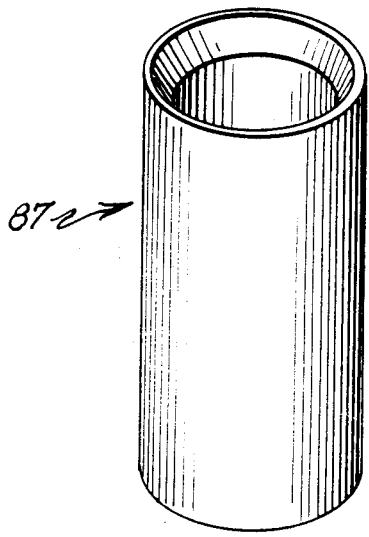
FIG. 35 is an enlarged isometric view of a brass bushing and conical depression therein for guiding the vacuum tube of a picker.

As seen in FIGS. 15, 35, and 36, lower housing 78 includes a tubular passage through the length thereof at 86; and a brass bushing 87 (FIGS. 35 and 36) having a conical depression in the top portion thereof is situated at the top and bottom of the passage 86 so as to provide a tapered leading on top of each bushing and thus guide and precisely align picker tube 32 as it is extended into and through passage 86.

A flipper rotation motor 134 (FIG. 13) is also attached to upper housing 76, with rod 132 depending downwardly through and rotational within lower housing 78 according to actuation of motor 134. At the lower end of rod 132, is attached a flipper 111 for laterally transferring drill bits back and forth between the collet 72 (FIG. 25) of drill module 70 and the vacuum tube 32 that is extendable through passage 86 of lower housing 78.

As seen in FIG. 26, the flipper 111 comprises a main body 112 attached by set screw 114 to the lower end of support rod 132 and has an opening therein defining a "replacement bit" pocket 116 with an O-ring 118 (FIG. 27) therein to slightly grip the collar of a replacement bit received therein. A split, "used bit" pocket 120 comprises cooperating portions of body 112 and a jaw 122 which is pivotally attached to body 112 at pivot point 126. As seen in FIG. 27, pivotal jaw 122 is provided with portion 124 having a beveled flange, as well as a vertical protrusion 130 (as seen, for instance, in FIGS. 23 and 26). The functions of these portions of jaw 122 will be explained in the following disclosure.

Figure 28:
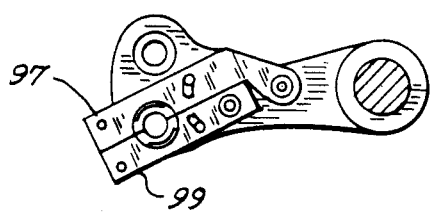
FIG. 28 is a top plan view of an alternate embodiment of the flipper.
Figure 29:
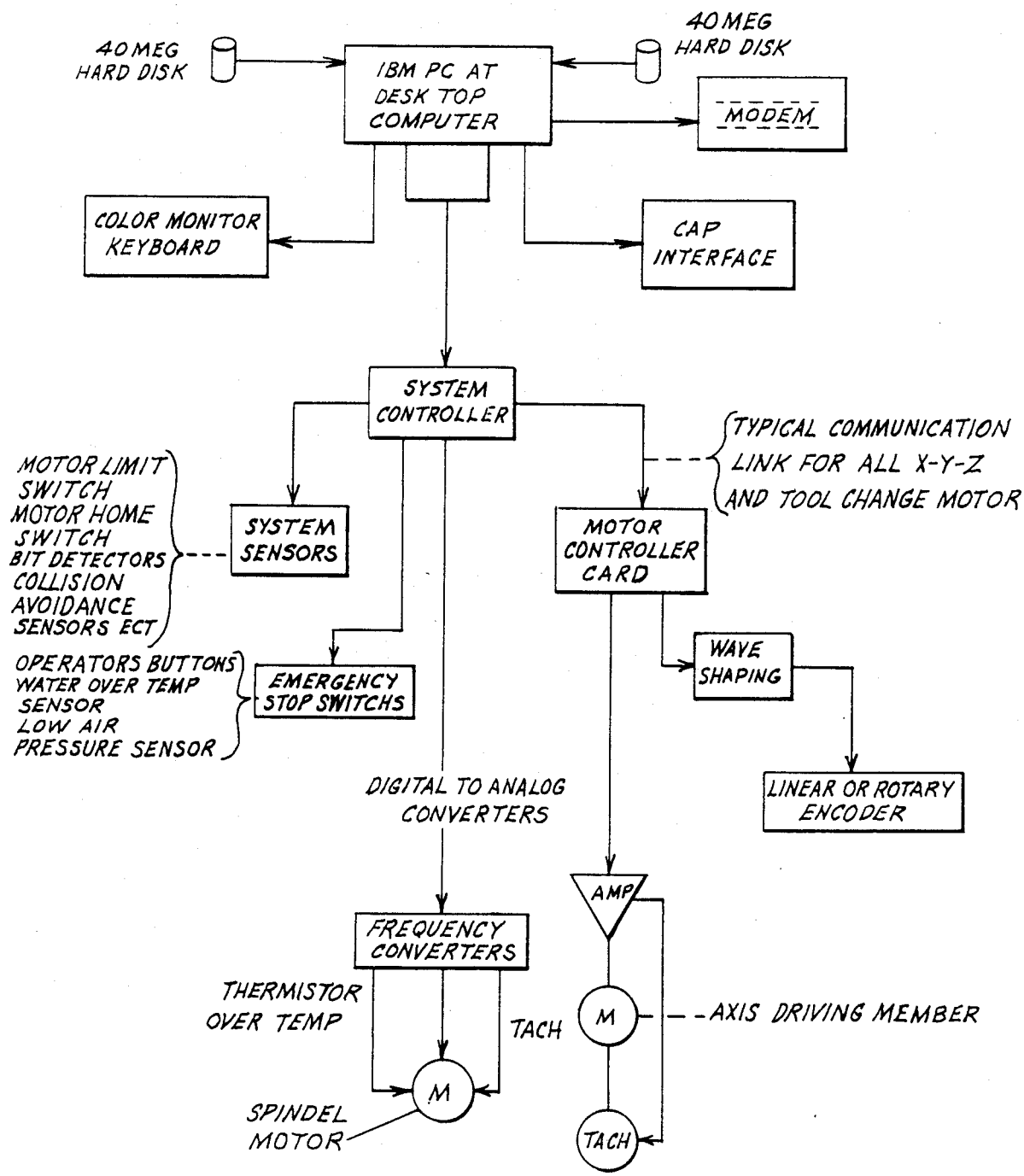
FIG. 29 is a block diagram illustrating various portions of the overall machine and the control for them.

An alternate embodiment of the flipper assembly is illustrated in FIG. 28 wherein the body has two complete pockets therein with the "used" bit pocket having two cooperating jaws 97 and 99 positioned thereabove and actuatable in unison. Each jaw has a beveled portion similar to portion 124 of FIG. 27 and for substantially the same purpose, i.e., holding collar 72 during removal of a bit from a drill.

OVERALL OPERATION OF THE MACHINE

Figure 7:
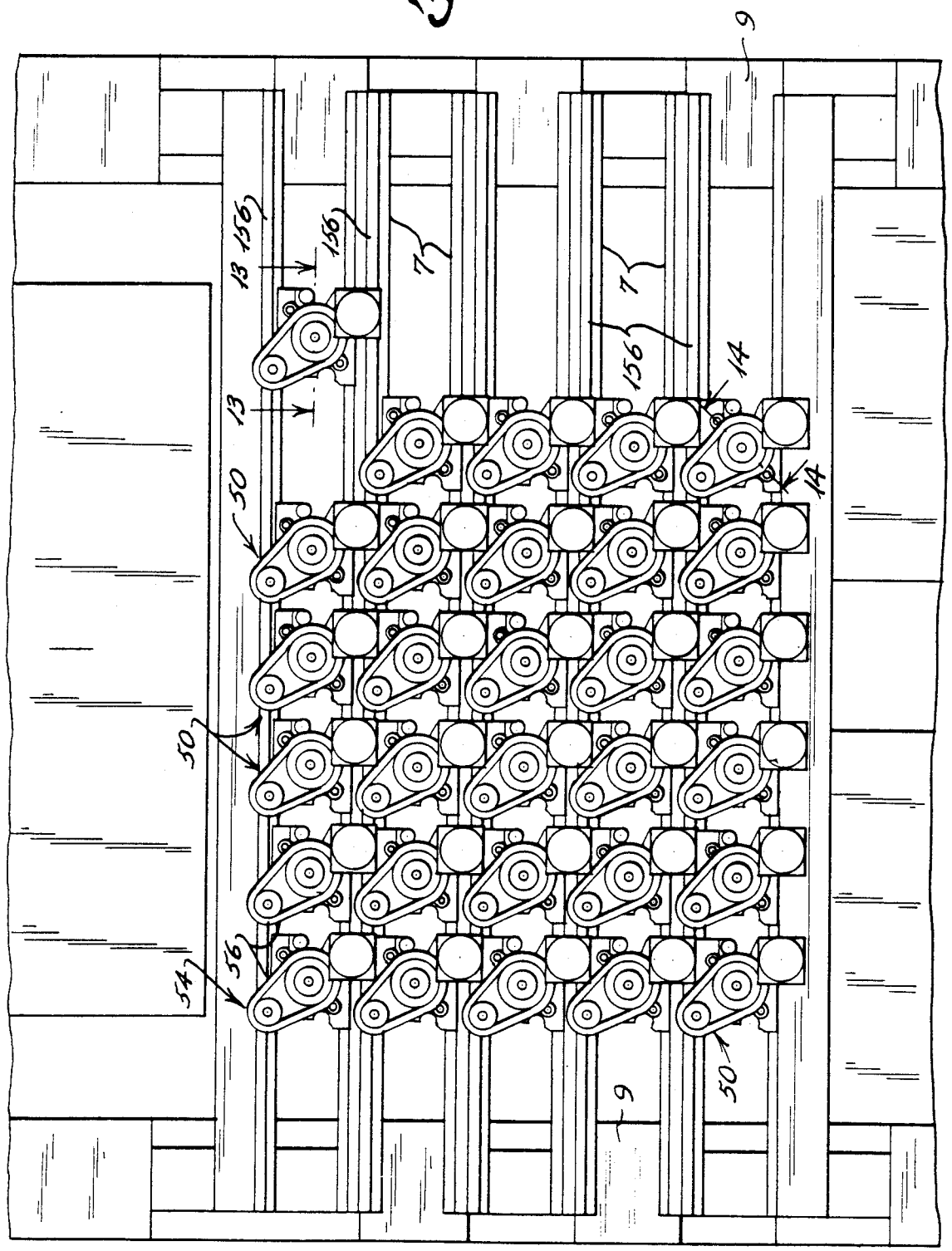
FIG. 7 is a top plan view of the device of FIG. 2.

Referring to FIGS. 2 and 7, the work to be drilled may be totally positioned under all of the drill assemblies 50 or may be incrementally advanced in the direction Y, according to the number of holes to be drilled in the board and the positioning thereof. In either event, each drill assembly 50 is shiftable in X, to establish the point in the X-Y plane of the work at which it will drill a hole. Thus, each drill can drill one or more holes in the work as required. Periodically during operation of the machine it is necessary to replace a worn or broken drill bit 74, and the instant invention particularly provides for efficient rapid changing of such drill bits.

Figure 8:
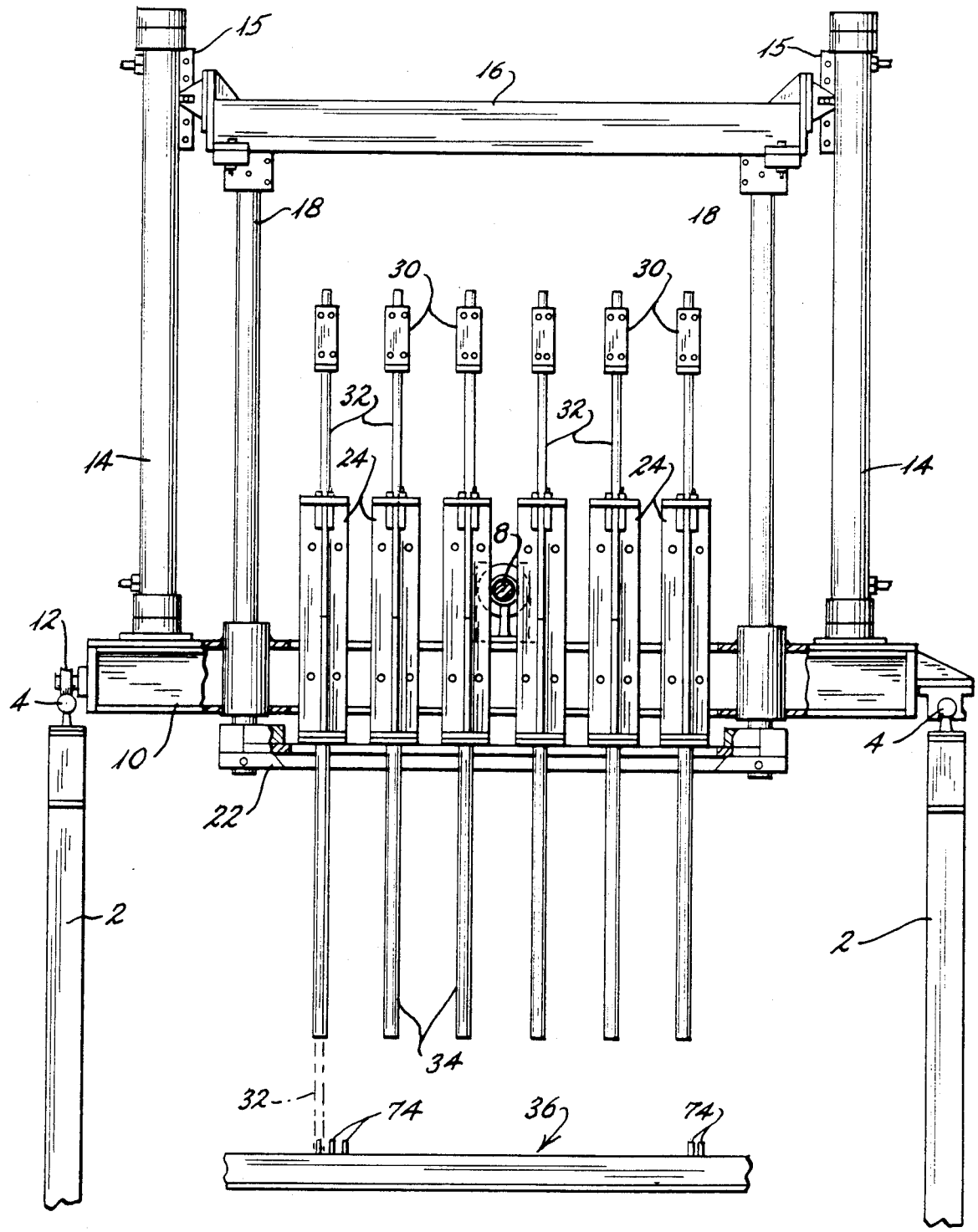
FIG. 8 is a front elevation of the picker support apparatus of the invention.
Figure 9:
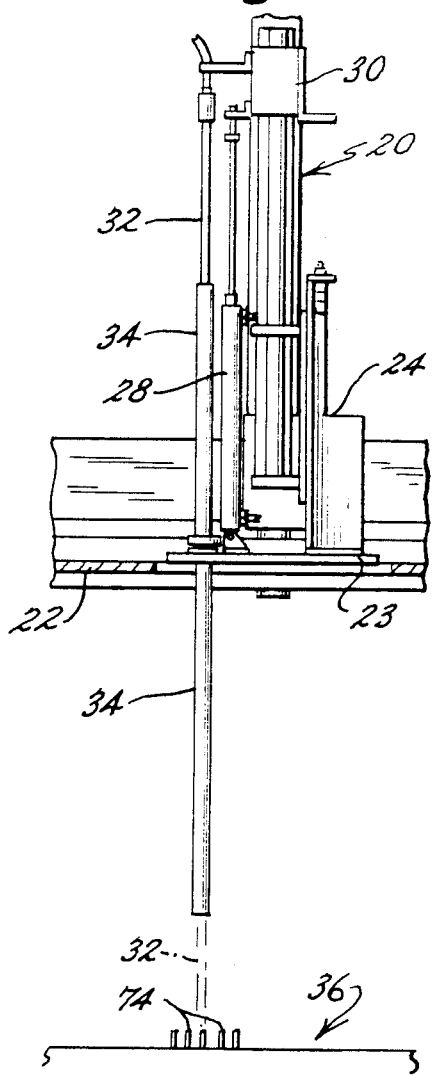
FIGS. 9 and 10 are side elevations illustrating operation of a picker device during transfer of a bit to or from the supply tray.
Figure 10:
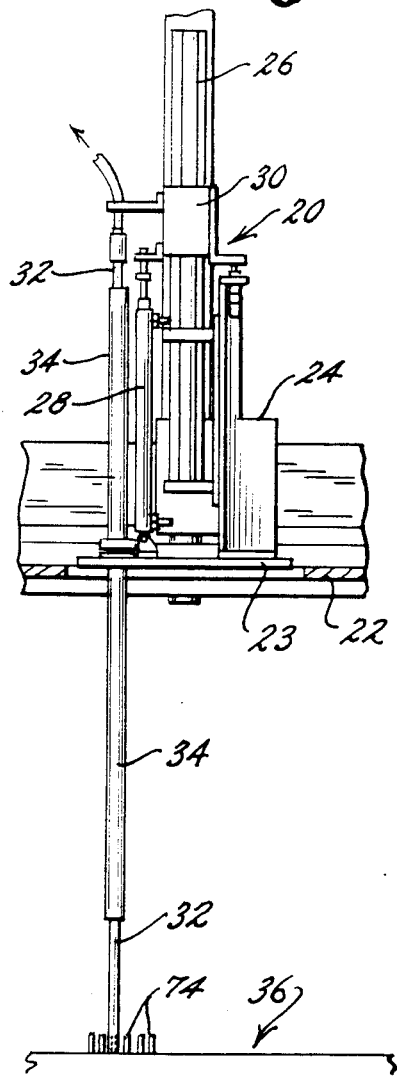
Figure 11:
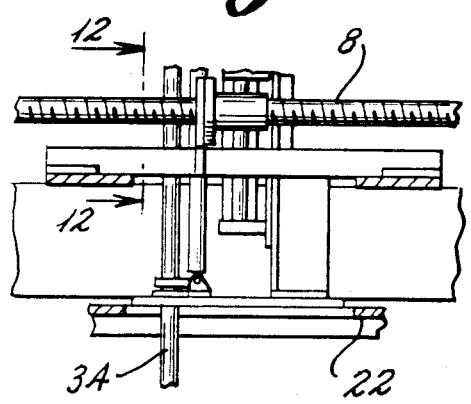
FIG. 11 is a partial side elevation illustrating the attachment of the picker platform to a screw used for positioning the platform along the Y axis.
Figure 12:
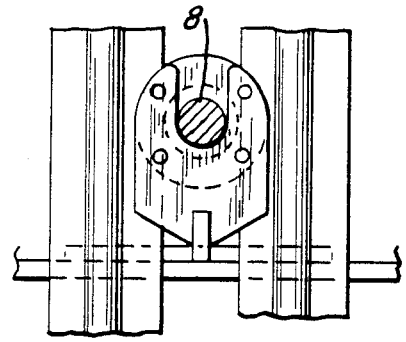
FIG. 12 is a partial cross sectional view, as generally indicated by the arrows 12—12 of FIG. 11.

When it is necessary to replace one or more drill bits, picker carriage 10 and tray platform 36 are relatively positioned in X and Y for positioning the appropriate replacement bit in line with a picker vacuum tube 32. At least one of the vacuum tubes 32 is telescoped out of its support 34 by actuation of cylinder 28 (as seen in FIGS. 8-10), and the appropriate replacement bit is gripped by vacuum and retrieved by retracting the vacuum tube 32 back into its support 34. Thereafter, tray platform 36 is driven in X to a "home" position so as to position at least one row of tray openings 48 directly above a corresponding row of drill assemblies 50, with all of the drill assemblies 50 of that row also returned to a "home" position into alignment with overhead openings 48 of the supply tray 42. Then, as seen in FIGS. 8 and 17, cylinders 14 may be actuated to lower platform 22 with all of the vacuum picker modules 20 in unison such that guide tubes 34 of the picker modules 20 pass through openings 48 and tray 42 and are lowered to a position just above, or into engagement with, passages 86 of each corresponding drill assembly lower housing 78.

Figure 18:
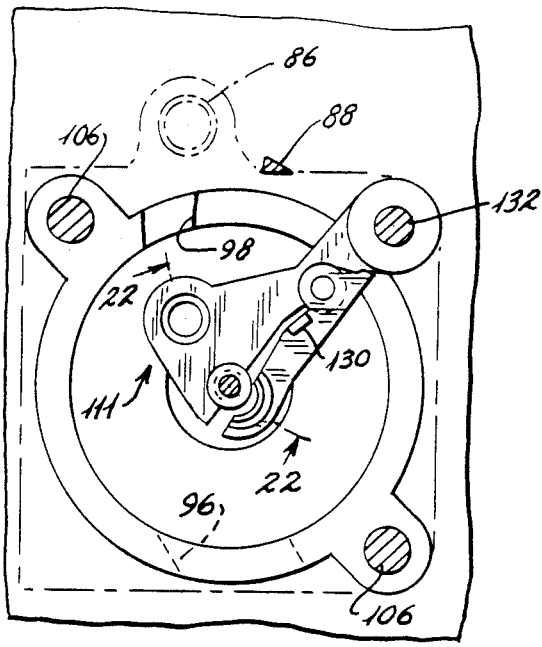

At this time or prior hereto, drill module 70 is raised by actuation of motor 54 and flipper assembly 111 is pivoted counterclockwise (CCW) as viewed in FIG. 18 by motor 134 to position split pocket 120 in line with the drill bit 74. Drill module 70 is lowered again such that the collar 75 of drill bit 74 engages the beveled portion of member 124 and opens pivotal jaw 122 against the bias of spring 128. Once collar 75 has completely cleared the bevel of portion 124, the collet of drill 70 is opened to release bit 74 and drill module 70 is raised clear of the drill bit 74. Referring to FIGS. 18 and 22, the jaw 122 of the flipper is biased closed by spring 128 so that portion 124 extends over the top of drill bit collar 75 to ensure that the bit is retained in pocket 120 during raising of drill module 70.

Figure 19:
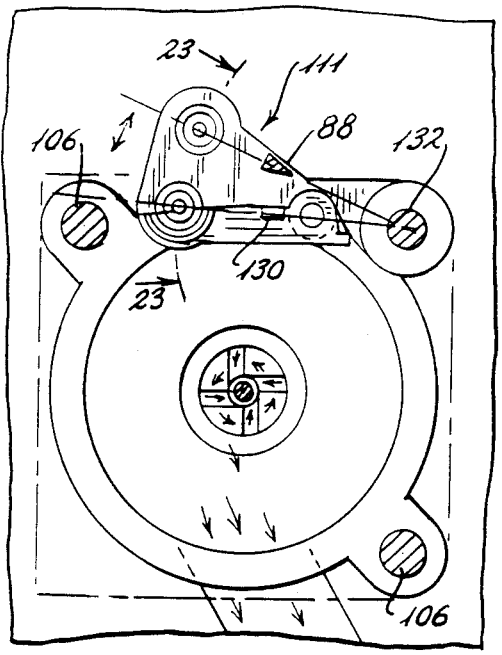
FIGS. 18-21 are partial cross sections looking down into a pressure foot and illustrating the various positions of the flipper during the bit changing operation.

Thereafter, as seen in FIGS. 19 and 23, flipper 110 is pivoted clockwise (CW) sufficiently to align pocket 116 with passage 86 for insertion therein of the replacement bit by vacuum nozzle 32. The O-ring 118 (FIG. 27) retains the replacement bit in pocket 116.

Figure 20:
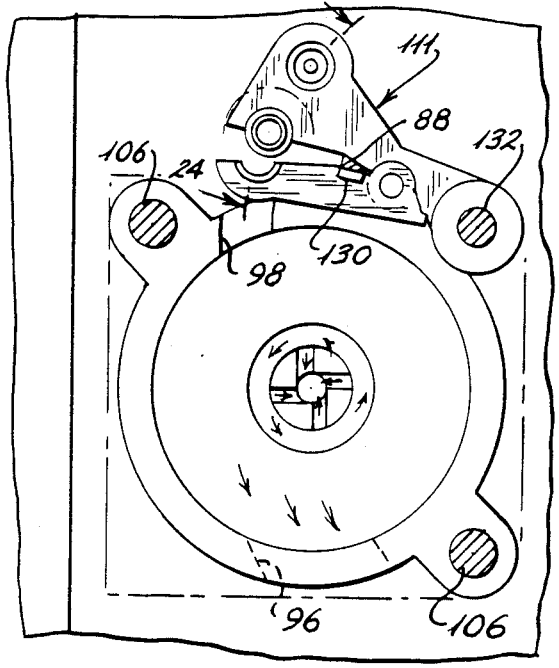
Figure 21:
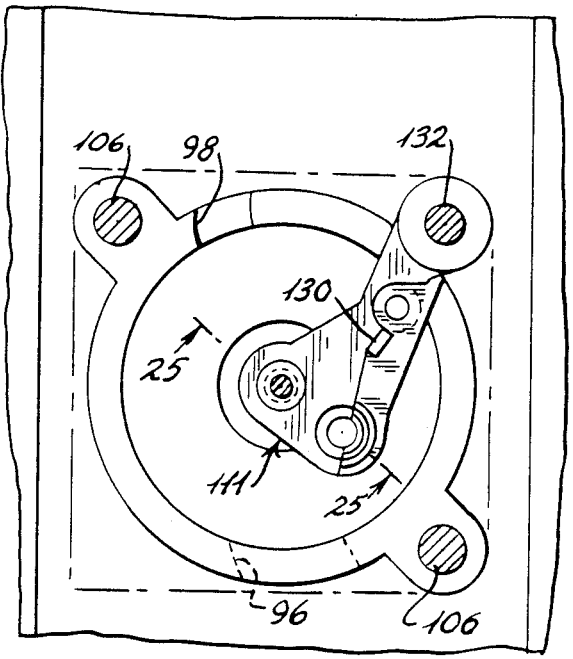
Figure 30:
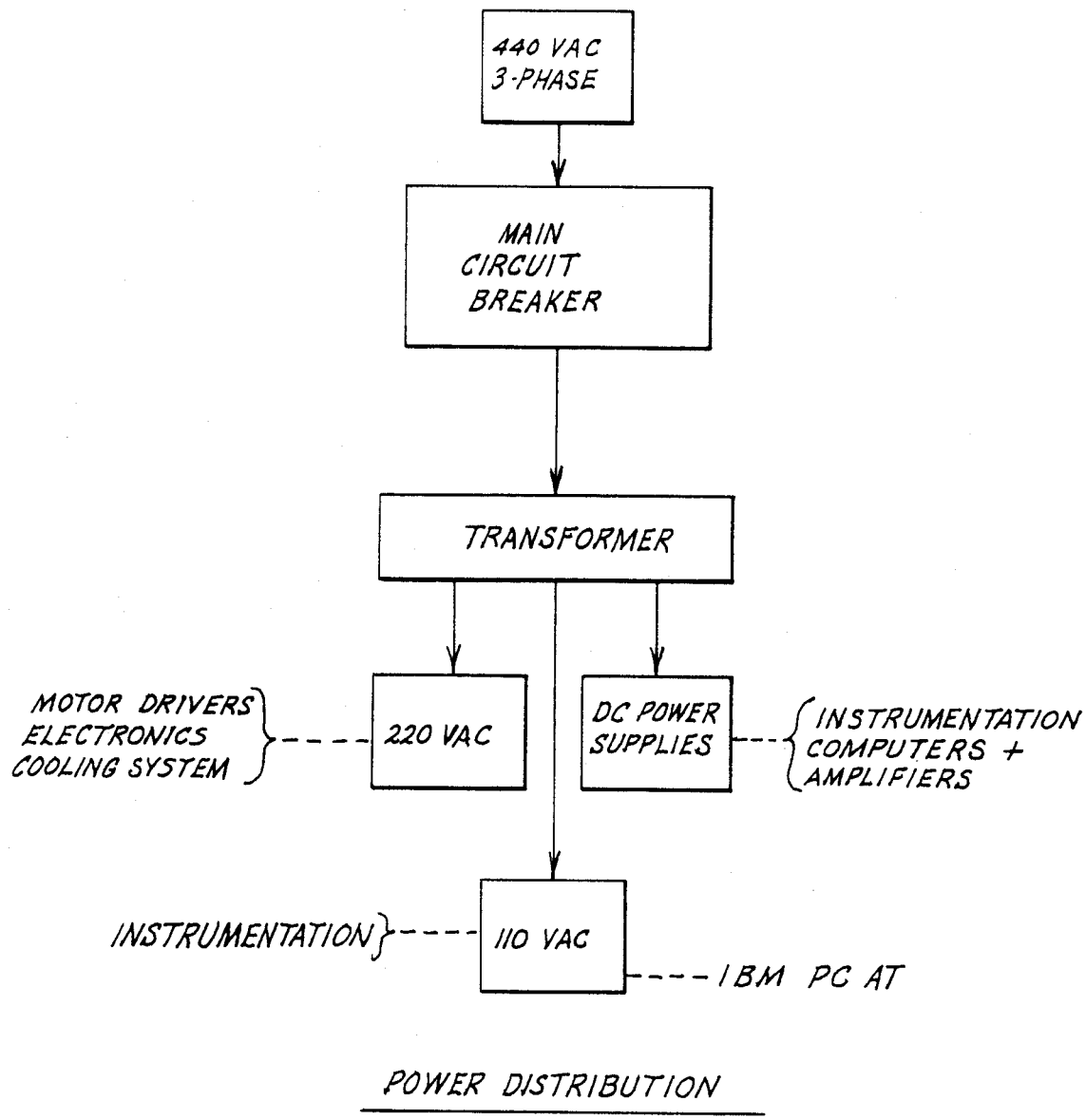
FIG. 30 is a power distribution block diagram for the device of the invention.

Upon sufficient retraction of vacuum nozzle 32 by cylinder 28, flipper 110 is rotated CW further to align split pocket 120 with passage 86 (as seen in FIGS. 20 and 24) and a vertical protrusion 130 of jaw 122 engages a stop member 88 depending from housing 78 to open the jaw, as seen in FIG. 20. Thus, the member 124 is cleared from the top of the drill bit collar and the used bit may be retrieved from pocket 120 by extension and retraction of vacuum nozzle 32.

A slot 98 (FIGS. 16 and 18-25) may be provided in pressure foot 90 in order to minimize clearance required to pass a drill bit through the side wall of pressure foot 90. FIGS. 18-21 also reveal a phantom-lined opening 96 through the side wall of pressure foot 90 so that scrap or chad may be evacuated by vacuum (as discussed earlier) in the direction indicated by arrows.

Flipper assembly 111 is then pivoted CCW to align pocket 116 with the Z axis 52 and the drill module 70 is lowered to grip the replacement drill bit 74 in collet 72 and, upon re-raising drill module 70 with the replacement bit, flipper assembly 111 is pivoted back to the position illustrated in FIG. 19 and out of the path of the drill module 70.

Once the used bit has been grasped by vacuum nozzle 32 as illustrated in FIG. 24, the cylinders 14 may be actuated to raise platform 22 with all of the picker modules 20 thereon to the position of FIG. 8, whereupon the earlier described X-Y positioning between supply tray 42 and the vacuum nozzle 32 is performed and nozzle 32 is extended to place the used bit in a vacant location on the tray 42.

During raising and lowering of drill module 70, a tie bar 66 (FIG. 14) attached to ball screw 62 is also raised and lowered. During lowering, tie bar 66 engages the upper end of cylinders 110 to push pressure foot 90 into engagement with the work (against the upward biasing of springs 104 at the top of rods 100). The amount of pressure applied to the work is adjustable via the air pressure supplied to cylinders 110. For instance, the air pressure on a prototype was adjustable between 10-30 psi and set for a nominal value of 20 psi.

Figure 31:
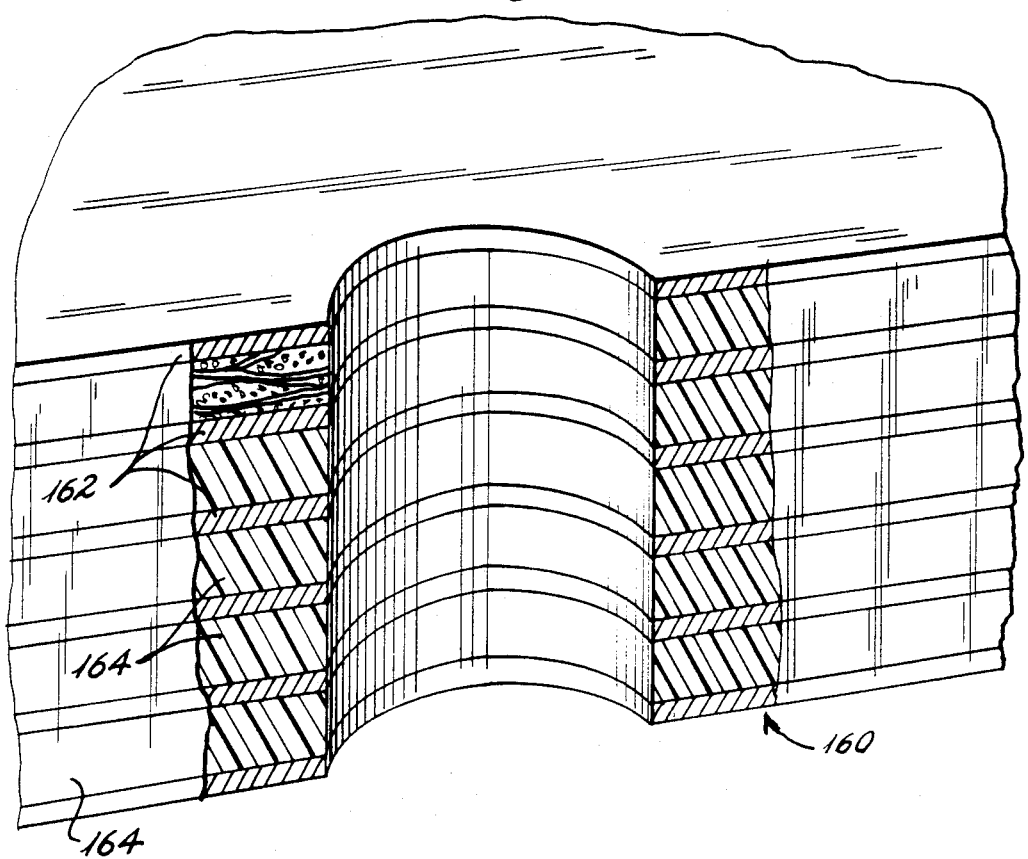
FIG. 31 is a partial cross section through a hole in a multi-ply circuit board, illustrating the various layers of insulating and conducting materials.
Figure 32:
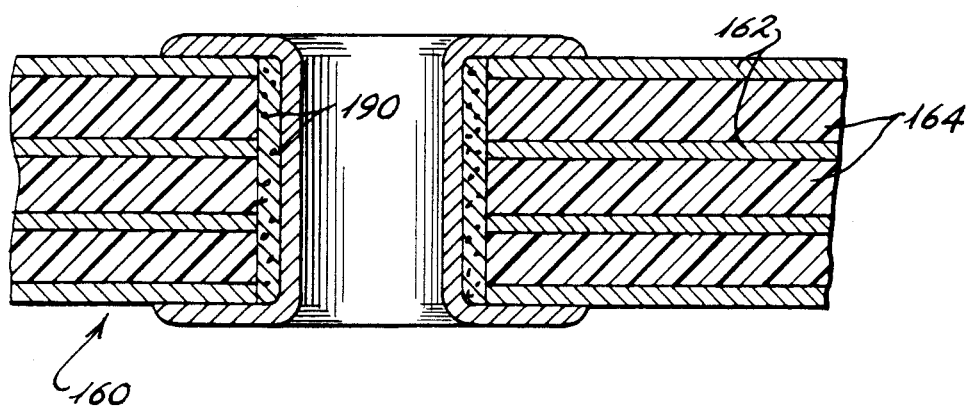
FIG. 32 is a partial cross section somewhat similar to that of FIG. 31 after a ferrule is formed.

As discussed earlier; the footprint at which pressure is applied to the work by pressure foot 90 can have a profound effect upon the quality of the holes being formed in the work to which the invention is directed, and the reader's attention is particularly directed to FIGS. 31-34 for a better understanding of the particular problems involved As seen in FIG. 31, the work may comprise alternating layers of copper 162 and a nonconductive resin 164 or the like defining a so-called "stack" or multi-layer circuit board 160 through which the holes are to be drilled.

Figure 33:
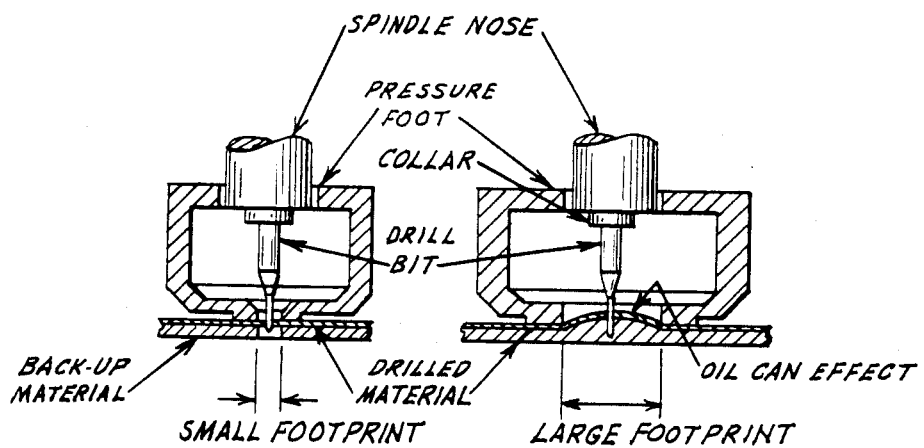
FIG. 33 illustrates the difference between small and large footprints of the pressure foot and an effect thereof.
Figure 34:
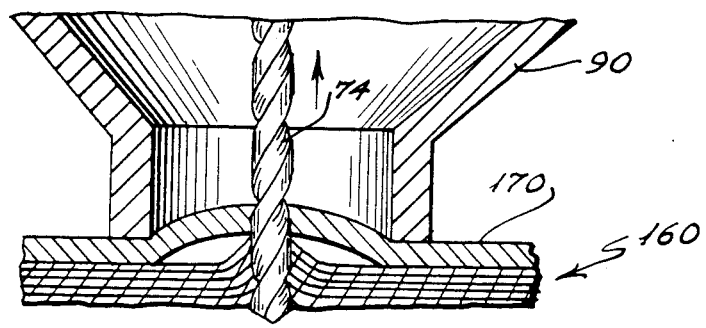
FIG. 34 is a partial cross section further illustrating problems inherent with a pressure foot having a large footprint.

Even though it is standard practice to use an aluminum or aluminum-clad overlay material 170 (FIG. 34) on top of the "stack" so as to reduce disruption of the planarity of the layers of stack 160 during such drilling, the overlay material and/or work can experience the "oil can effect" illustrated in FIG. 33 when the pressure foot is provided with a relatively large footprint hole so that the drill bits can be changed by passing through the lower pressure foot opening. This "oil can effect" can result in burring of the "stack" and/or the formation of wicking paths between the layers of the stack, especially during withdrawal of the drill bit from the work.

Another problem inherent in the industry involved is that of resin "chad" being transferred to a subsequently drilled hole via the flutes of the drill bit. Although it is typical of the prior art to draw a vacuum on pressure foot 90 in order to remove the scrap, such transferal of chad and so-called "smears" or packings still occur on the interior of subsequently drilled holes from the flutes of the drill bit. These smears are non-uniformly distributed over the internal diameter of the hole and can result in the earlier described problems of ferrule "pops" and/or blocking of conductivity between various copper layers 162 and the non-electrically applied copper, as well as the subsequently electroplated copper ferrule. However, by the instant invention, the vacuum effect on the flutes of the drill bit are increased at the opening of the pressure foot. Various sized inserts 92 (FIG. 16) may be utilized according to the drill bit diameters and the nature of the work so as to overcome these above described deficiencies. O-ring 94 may be used to retain inserts 92 in pressure foot 90.

Having described the invention, it may be seen that the objects set forth above, among those made apparent from the preceding description, are efficiently obtained and, since certain changes may be made in carrying out the above method and in the construction set fort without departing from the scope of the invention, it is intended that all matter contained in the above description or shown in the accompanying drawings shall be interpereted as illustrative and not in a limiting sense.

It is also to be understood that the following claims are intended to cover all of the generic and specific features of the invention hereindescribed, and all statements of the scope of the invention which, as a matter of language, might be said to fall therebetween.

We claim:

1. In a method of drilling holes in thin panel material with drill bits having enlarged portions said method comprising the steps of applying pressure to said material via a pressure foot surface defining a footprint and generally surrounding and proximate each hole during drilling thereof in order to minimize disruption of a planarity of said material by a drill bit, said drill bit passing through a hole of said footprint during said drilling, and removing said bit from a drill and replacing it with new bit as required, the improvement comprising the steps of:

providing said footprint hole with a diameter less than that of said enlarged portions of said drill bits in order to further minimize said planarity disruption by use of said pressure foot; and retaining said pressure foot hole and drill generally coaxial while performing said removing and replacing without passing said enlarged portions of said bits through said footprint hole.

2. The improvement of claim 1, wherein said method further comprises a step of evacuating chad, produced during said drilling, from within said pressure foot by means of vacuum, and further comprising the step of:

improving said evacuating by minimizing said pressure foot hole diameter.

3. The improvement of claim 2, and further comprising the step of:

providing fluting within said pressure foot so as to provide vortex suction action for improved evacuation of said chad.

4. The improvement of claim 1, and further comprising the steps of:

providing a supply tray of replacement bits above said drill; and replacing said supply tray during said drilling.

5. The improvement of claim 1, and further comprising the steps of:

providing plural rows of drills each positionable relative to an assigned hole location of said thin panel material;

selectively moving said panel material and individual ones of said drills relative to each other in X and Y in order to accomplish said positioning; and selectively moving said drills in Z in order to accomplish said hole drilling.

6. The improvement of claim 5, and further comprising the steps of:

providing a supply of replacement bits situated above and in non-interfering relation with said drills;

providing at least one vacuum picker;

positioning said picker and supply relative to each other according to a selected new bit to be retrieved from said supply and retrieving the selected bit;

repositioning said picker and supply relative to each other and aligning said picker with a corresponding hole through said supply tray;

extending said picker in Z through said tray and transferring said new bit to a flipper means for laterally transferring said new bit to said drill; and performing said transferring.

7. The improvement of claim 6, and further comprising the steps of:

retrieving a used bit from said drill via said flipper means; and retrieving said used bit from said flipper means by said picker.

* * * * *